United States Patent [19]

Kaplan

[11] Patent Number: 4,471,237

[45] Date of Patent: Sep. 11, 1984

[54] OUTPUT PROTECTION CIRCUIT FOR PREVENTING A REVERSE CURRENT

[75] Inventor: Leonard A. Kaplan, Fords, N.J.

[73] Assignee: RCA Corporation, New York, N.Y.

[21] Appl. No.: 407,897

[22] Filed: Aug. 13, 1982

[51] Int. Cl.³ .................... H03K 17/16; H03K 17/60
[52] U.S. Cl. ................................. 307/443; 307/454; 307/549
[58] Field of Search .............. 307/443, 446, 454, 456, 307/491, 503, 354, 549, 570, 253, 264

[56] References Cited

U.S. PATENT DOCUMENTS

| | | | |
|---|---|---|---|
| 3,699,362 | 10/1972 | Jordan | 307/443 |
| 3,704,383 | 11/1972 | Ault et al. | 307/443 |
| 3,727,072 | 4/1973 | Madrazo et al. | 307/443 |
| 3,974,404 | 8/1976 | Davis | 307/443 X |
| 4,413,194 | 11/1983 | Birch | 307/443 X |

Primary Examiner—Stanley D. Miller
Assistant Examiner—David R. Hudspeth
Attorney, Agent, or Firm—Joseph S. Tripoli; George E. Haas; Henry I. Schanzer

[57] ABSTRACT

In an integrated circuit in which an output transistor connected between an output terminal and a point of reference potential normally conducts current in one direction between the output terminal and the reference point and in which a potential may be developed at the output terminal causing a reverse current (i.e. one of opposite direction to the one direction) between the reference and the output terminal through the substrate, circuitry is coupled to the output terminal which is responsive to values of reverse potential at the output terminal for providing a control current at the output terminal and for holding its voltage at a value which limits the flow of reverse current.

6 Claims, 4 Drawing Figures

OUTPUT PROTECTION CIRCUIT FOR PREVENTING A REVERSE CURRENT

This invention relates to means for controlling the flow of reverse current in an integrated circuit.

A problem exists when a reverse current is drawn from (or into) the output terminal of an integrated circuit (IC). The problem is particularly acute when several, separate, circuits are formed on the same IC or chip because the reverse current in one circuit can then modulate the current flowing in the other circuits. The extent of the problem is best explained by reference to the schematic circuit diagram of FIG. 1 and to the corresponding cross sectional diagram of FIG. 2.

Figure 1:
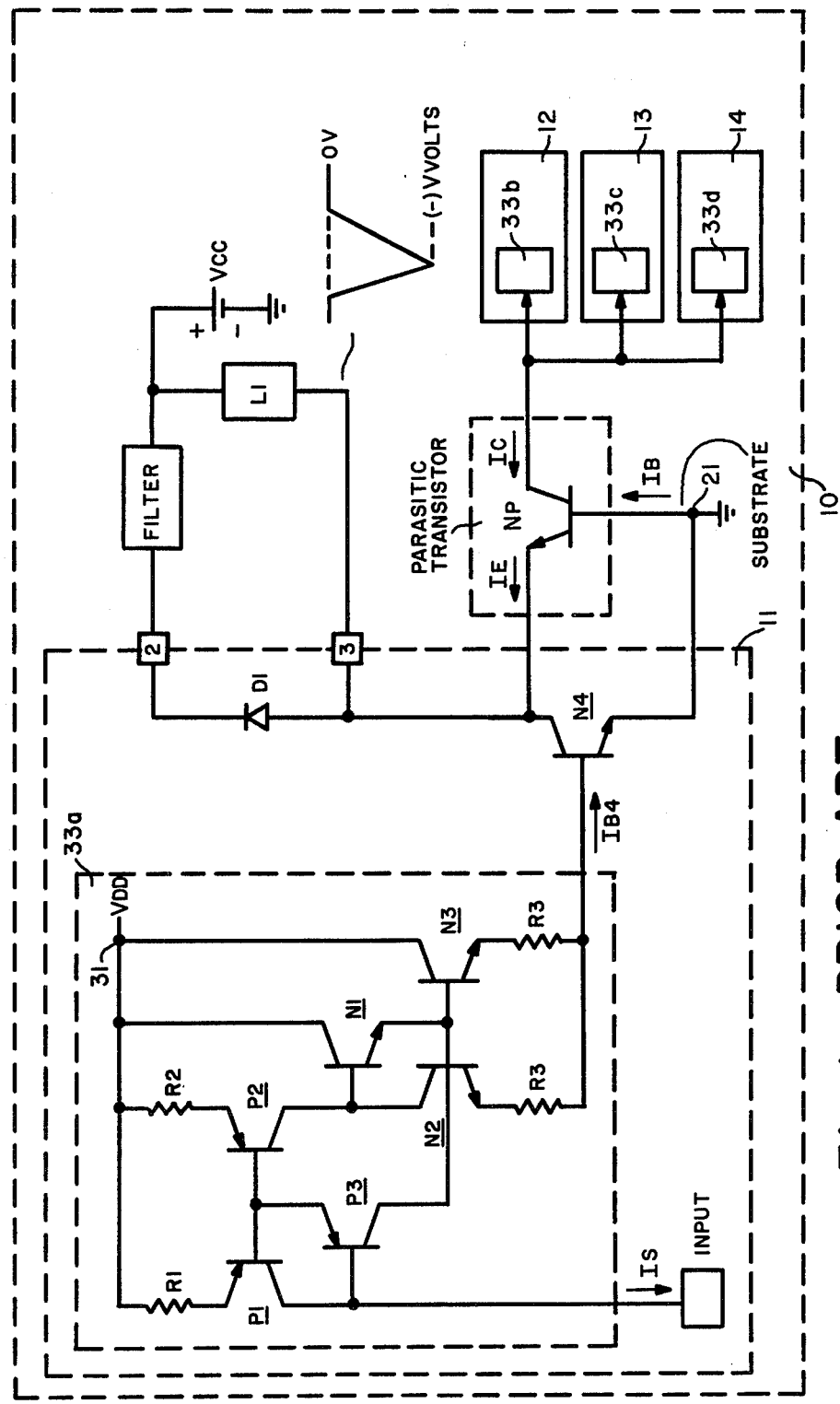

FIG. 1 shows four circuits (11, 12, 13 and 14) formed on an IC 10. The four circuits may be any one of a number of different circuits or they may all be of the same type. Circuit 11 includes an input signal responsive current multiplier stage 33a, driving an output transistor N4, whose collector is connected to an output terminal 3 to which is connected an inductive load, L1, which may be a stepper motor. During a part of its operating cycle (e.g. at the end of a stepping function), load L1 may produce a large negative voltage spike of $-V$ volts amplitude (where $-V$ is in excess of 0.8 volt), as shown in FIG. 1, which causes a reverse current to flow from the grounded substrate 21 and via the base-to-emitter path of a parasitic transistor $N_P$ and output terminal 3 into the load. The base-to-emitter current causes collector current (IC) flow in $N_P$. The current gain (Beta) of $N_P$ is typically very low (i.e. significantly below 1). However, when the magnitude of the reverse current (i.e. the current drawn from the substrate and into the load) is in the order of 100 milliampere (or higher) even if the forward current gain (i.e. Beta) of transistor $N_P$ is in the range of 0.01, substantial current (i.e. 1 milliampere or more) will flow in the collector-to-emitter path of $N_P$. The collector of $N_P$, as discussed below, is common to the base regions of transistors of P-conductivity type formed in adjacent circuits 12, 13, or 14 which may include in circuits 33b, 33c, and 33d circuitry of the type shown for current multiplier 33a.

The collector current drawn by $N_P$ interferes with the status of the other circuits sharing the same substrate. This is best explained by reference to the cross section diagram of FIG. 2 which shows portions of circuits 11, 12, and 13. IC 10 includes a common grounded P-type-substrate 21 on which are formed circuits 11, 12, 13 and 14. The several circuits are isolated from each other by isolation regions 48 of P+ conductivity type. The portion of circuit 11 shown in FIGURE 2 includes transistor N4 with its N+ conductivity type collector region 50 which is returned to output terminal 3, its P-type base region 52, and its N+ conductivity type emitter region 54 which is returned to ground.

It is assumed that circuits 12 and 13 include PNP transistors such as P1, P2 or P3 shown in stage 33a of FIG. 1. Thus, circuits 12 and 13 include P regions 61, 62, and 63 diffused in an N-type epitaxial region 60 and P regions 71, 72, and 73 diffused in an N-type epitaxial region 70. These regions may be used to form PNP transistors which, by way of example, are used as current mirrors to control the supply of current from the positive terminals of the power supplies into the bases of output transistors such as N4.

In the absence of any reverse current, substrate 21 remains at the lowest potential applied to the circuit and there is a relatively high degree of isolation between the various circuits formed on chip 10. However, when the collector region of N4 goes negative with respect to the grounded substrate 21 a parasitic lateral transistor $N_P$ formed within and as part of the IC can conduct. Region 50 (the collector of N4) now functions as the emitter of $N_P$, isolation region 48 and the substrate 21 now function as the base of $N_P$, and the N-type epitaxial layers 60 and 70 (in which are formed the P regions of the PNP transistors of circuits 12 and 13) now function as the collector of $N_P$. Any collector current drawn by $N_P$ is actually drawn out of regions 60 and 70 in circuits 12 and 13 causing false and erroneous conditions in those circuits. $N_P$ can either draw current out of the bases of PNP transistors (similar to P1 and P2) in adjacent circuits removing the drive to their associated output transistors or else $N_P$ can draw current out of the base of PNP transistors (similar to P3) falsely turning-on their associated output transistor.

Several solutions have been proposed but have not eliminated the problem. For example, the problem discussed above may be reduced by increasing the width of isolation regions 48. However, the problem of conduction via $N_P$ still exists and valuable chip space which might better be employed for other circuits is lost. Another solution calls for the connection of a diode poled to block the flow of reverse current in series with the conduction path of N4. However, this is not practical because when N4 is switched on, it is necessary to be able to clamp terminal 3 very close to ground (i.e. one $V_{CE\,SAT}$ above ground) and the diode would hold the output voltage at a higher voltage level (equivalent to one forward voltage ($V_F$) drop above $V_{CE\,SAT}$. Still another solution calls for an additional diode to be formed in parallel with, and poled to conduct in the same direction as, the base-to-emitter region of $N_P$ in order to divert some of the current from the base-to-emitter of $N_P$. However, this additional diode would still allow current flow through the base-to-emitter of $N_P$ and the flow of collector-to-emitter current.

In contrast to some of the solutions suggested above which attempt to reduce the problem by controlling the geometry of various devices and their current paths, the present invention follows a different approach. In a circuit embodying the invention, a normally non-conducting means is coupled between the output terminal and a voltage source. This means is responsive to a reverse potential at the output terminal when it attempts to exceed a given value turning-on the normally non-conducting means for causing a flow of current via said means between said voltage source and said output terminal of a magnitude sufficient to prevent the voltage at said output terminal from exceeding said given value.

Figure 2:
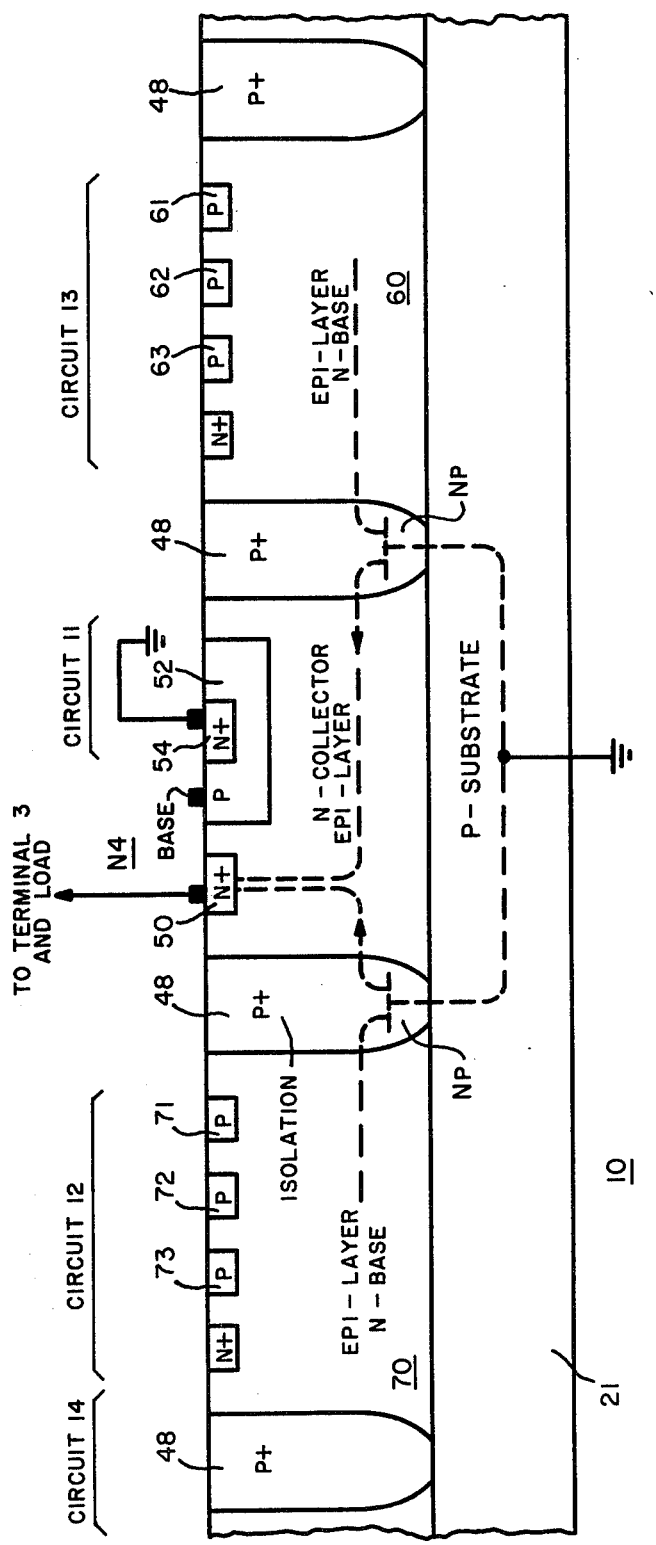
Figure 3:
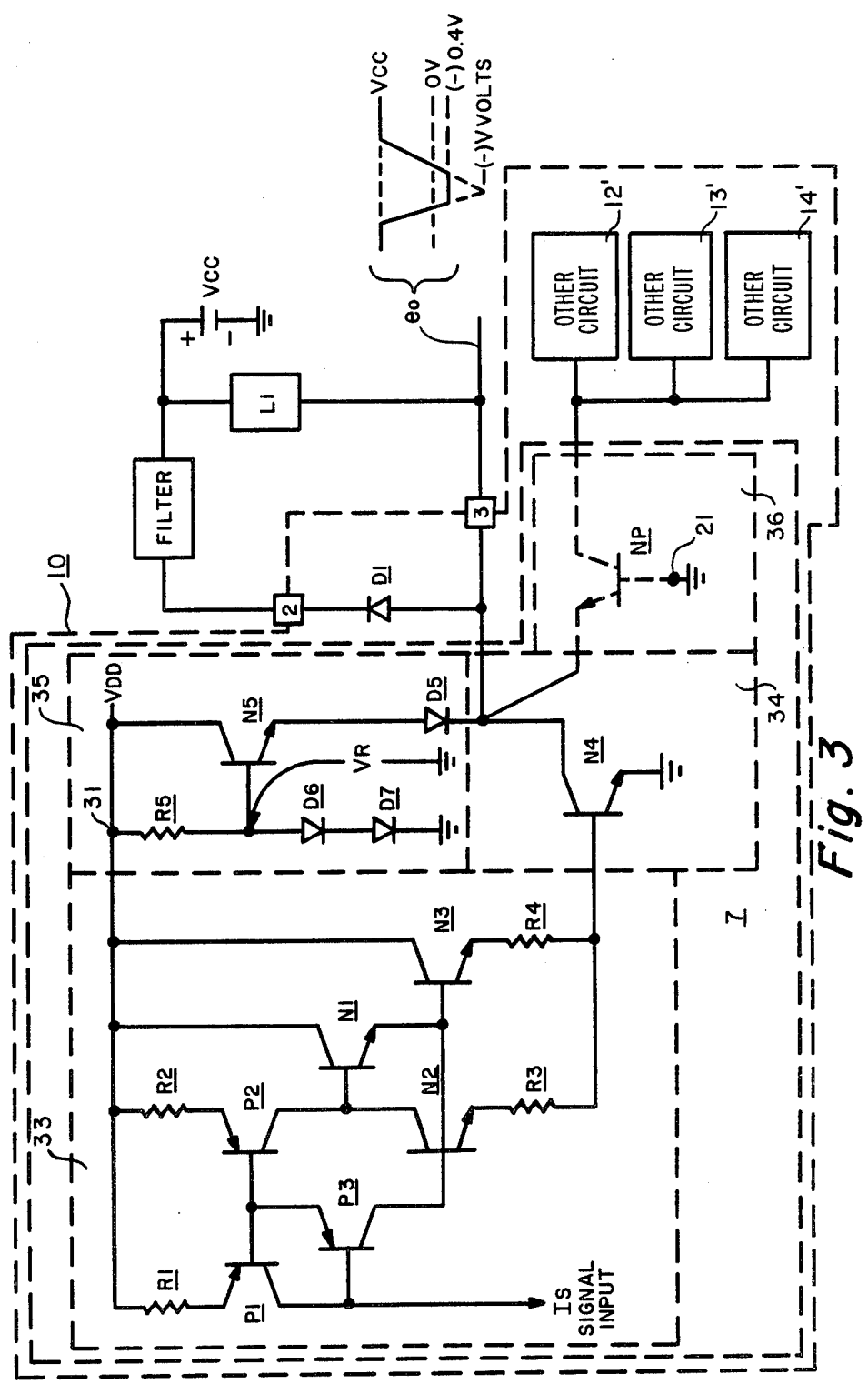
Figure 4:
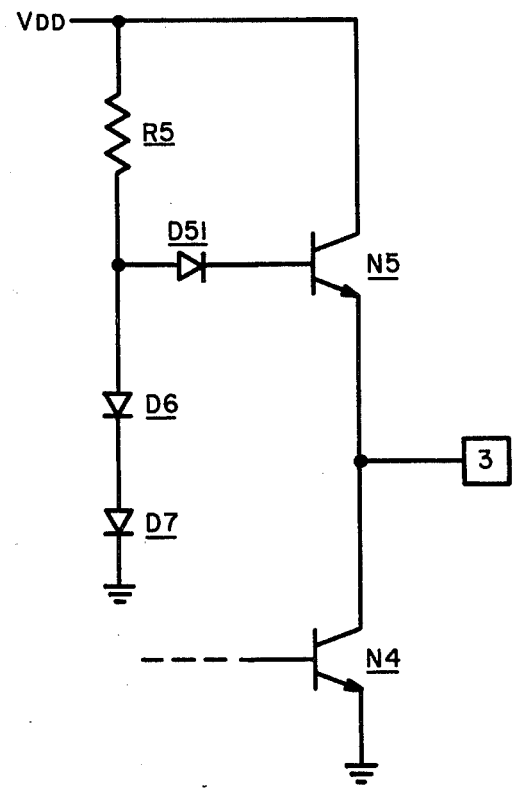

In the accompanying diagram like reference characters denote like components, and:

FIG. 1 is a schematic diagram of a prior art circuit;
FIG. 2 is a cross-section diagram of portions of the circuit of FIG. 1;
FIG. 3 is a schematic diagram of a circuit embodying the invention; and
FIG. 4 is a schematic diagram of another embodiment of the invention.

FIG. 3 shows one circuit 7 of several circuits (not shown) formed on an IC 10 of the type illustrated in FIGS. 1 and 2 and discussed above. Circuit 7 includes an input stage 33a, an output stage 34, a protection stage 35 and parasitic circuitry 36. Stages 33, 34 and 36 are similar to the prior art circuitry discussed above and need not be greatly detailed. Input stage 33a is responsive to an input signal current ($I_S$) to produce a current Ib4 into the base of transistor N4. The output stage 34 includes transistor N4 which, when turned-on, draws current from a source of $V_{CC}$ volts via load L1 and conducts the current via its collector-to-emitter path to ground. N4 can, when saturated, clamp terminal 3 close to ground potential. The parasitic circuitry 36 includes transistor $N_P$ which, as in FIGS. 1 and 2, may be represented with its emitter connected to the collector of N4, its base connected to the grounded substrate 21, and with its collector being part of the base regions of P-type transistors (not shown) of the circuits 12', 13' and 14' formed on the IC. Circuits 12', 13' and 14' may be of the same type as circuit 7 or else may be any one of a number of known circuits.

The protection stage 35 includes a transistor N5 connected at its collector to node 31, to which is applied $V_{DD}$ volts, at its emitter to the anode of a diode D5 and at its base to a point of reference potential $V_R$. The cathode of D5 is connected to output terminal 3 to which is connected the collector of transistor N4. The reference voltage applied to the base of N5 includes a resistor R5 connected between node 31 and the base of N5 and diodes D6 and D7 connected in series between the base of N5 and ground potential. In the discussion to follow, the forward voltage drop of diodes D6 and D7 is assumed to be equal to 0.6 volts each. Hence, with $V_{DD}$ in the range of 5 to 10 volts the reference voltage ($V_R$) is assumed to be equal to 1.2 volts.

A load L1 is connected between the source of $V_{CC}$ potential (which, for example, may be the battery of an automobile) and terminal 3. As discussed above, during a portion of the operating cycle, the load may produce a negative going voltage swing of $-V$ volts at terminal 3 which exceeds 0.8 volt, in the absence of the protection circuit.

In the discussion to follow it is assumed that the forward voltage drop of diode D5 is 0.8 volt. That is, the voltage between the anode and the cathode of diode D5 must exceed 0.8 volt before current flows through the diode. Likewise the voltage that must be applied, or developed, between the base and emitter of N5 to turn-on N5 must equal or exceed 0.8 volt. Hence, the base-to-emitter voltage ($V_{BE}$) of N5 must equal 0.8 volt for N5 to conduct current. Since D5 is connected in series with the base-to-emitter of N5 the potential between the base of N5 and the cathode of D5 (terminal 3) must equal (or exceed) 1.6 volts for N5 to be turned-on.

For these conditions it can be shown that N5 does not conduct when N4 is on and clamping or holding the potential ($e_0$) at terminal 3 at or above zero volts, or if N4 is off and $e_0$ is above zero volts.

Typically, when a signal $I_S$ is applied to circuit 33 a current Ib4 equal to K·$I_S$ flows into the base of N4 (where K may have a wide range of values, e.g. 0.2 to 200). A load current IC4 which is equal to Ib4 multiplied by the forward current gain (Beta) of N4 can then flow through the load and via N4 to ground. Depending on the value of IC4 and the load impedance, N4 can drive terminal 3 to any potential between $V_{CC}$ volts (if $I_S$ is equal to, or close to, zero) and approximately zero volts. If N4 is driven into saturation it can clamp output terminal 3 to one $V_{CE\ SAT}$ above its emitter potential, where $V_{CE\ SAT}$ is typically between 0.1 and 0.7 volt.

Since the base of N5 is held at 1.2 volts and since the potential at terminal 3 is at least 0.1 volt, the potential across the base-to-emitter of N5 and D5, connected in series, is at most 1.1 volts when N4 is turned-on and conducts a load current from $V_{CC}$ via the load and its collector-to-emitter path to ground.

Hence, when N4 is ON or when N4 is OFF and the potential at terminal 3 is positive with respect to ground N5 cannot conduct (except for leakage currents which are neglected in this discussion) and no current flows through N5 or D5. When the voltage at terminal 3 is positive, diode D5 blocks the flow of current into the emitter of N5 and is designed to have a breakdown voltage which is sufficient to handle any positive spikes produced by the load at terminal 3. Thus, N5 will not conduct as long as the potential (V3 or $e_0$) at terminal 3 is above zero volts. In fact, there will not be substantial current flow through N5 until V3 decreases below $-0.4$ volt. Until that point is reached, the voltage across the base-to-emitter of N5 and D5 is less than 1.6 volts.

When V3 goes negative and starts to exceed $(-)0.4$ volt transistor N5 turns-on and conducts in the common base mode since there is now 0.8 volt across D5 and 0.8 volt across the base-to-emitter of N5. Transistor N5 then supplies current from $V_{DD}$ into terminal 3 and load L1 via its relatively low collector-to-emitter path and will tend to maintan V3 at $-0.4$ volt. If load L1 sinks more current tending to drive V3 more negative than $-0.4$ volt, N5 conducts more heavily, maintaining the potential at V3 at or close to $-0.4$ volt. With V3 held at $-0.4$ volt, transistor $N_P$ whose base is at the zero volts applied to substrate 21 does not conduct since its base-to-emitter voltage of 0.4 volt is below the critical voltage (0.8 volt) necessary to cause it to conduct.

With the parasitic transistor prevented from conducting, the transient current passed by N5 and sunk by the load does not affect the operation of the other circuits on the chip. Note that the current drawn by the load and supplied by N5 flows into the load and not into the substrate. This avoids the problem of burn-out or overheating of the substrate.

Means other than resistor R5 and diodes D6 and D7 could be used to generate the reference potential applied to the base of transistor N5 and the voltage applied to the base of N5 may be varied (raised or lowered) to control the point at which N5 turns on. Also, N5 may be made larger and transistors may be added to circuit 35 if more current gain is needed to prevent the voltage at terminal 3 from going negative.

Another circuit for limiting and controlling the negative potential at terminal 3 is shown in FIG. 4. Here a diode D51 is connected between the reference potential $V_R$ and the base of N5 and the emitter of N5 is returned to terminal 3. As in FIG. 4 N5 will only conduct when the potential across D51 and the base-to-emitter of N5 exceeds 1.6 volts. This circuit permits diode D51 to be smaller than in FIG. 3 since it conducts less current by a factor of 1/Beta as compared to that in FIG. 3.

What is claimed is:

1. In an integrated circuit (IC) in which the conduction path of an output transistor is connected between an output terminal and a first node of operating potential with its control electrode coupled to receive an input signal, and in which the output transistor normally conducts current in one direction between said output terminal and said first node and wherein a reverse potential may be developed at said output terminal which, when it exceeds a given value, tends to cause a reverse current to flow between said first point and said output terminal in a direction opposite to said one direction, means for counteracting the tendency of said reverse current to flow comprising:

a normally non-conducting control transistor having a base, an emitter, and a collector;

a reference voltage node for the application thereto of a reference voltage;

a second node for the application thereto of an operating potential;

means connecting the collector of said control transistor to said second node;

means connecting the base of said control transistor to said reference voltage node;

means, including a diode, connecting the emitter of said control transistor to said output terminal, said diode being poled to conduct in the same direction as the base-to-emitter junction of said control transistor; and wherein said reference voltage has a value to cause said control transistor to turn on before the reverse potential at said output terminal exceeds said given value, said control transistor, when turned on, causing a flow of current between said second node and said output terminal of a magnitude sufficient to prevent the voltage at said output terminal from exceeding said given value.

2. In an integrated circuit (IC) in which the collector of an output transistor is connected to an output terminal and its emitter and the substrate of the IC are returned to a first node of operating potential and the base of said output transistor is connected to a signal point; and in which the collector of said output transistor can function as the emitter of a parasitic transistor whose base is common to said substrate and whose collector is common to other circuits in said IC, and wherein a load connected to said output terminal can develop a reverse potential at said output terminal which, when it exceeds a given value, tends to cause a current to flow between the base and emitter of said parasitic transistor in a direction to cause said parasitic transistor to conduct, improved means for controlling the conductivity of the parasitic transistor comprising:

a normally non-conducting means connected to said output terminal including means responsive to said reverse potential for turning-on said non-conducting means when said reverse potential is at a first value whose magnitude is less than said given value, for then providing a current at said output terminal and developing a voltage at said output terminal preventing its potential from exceeding said given value.

3. In an integrated circuit (IC) the combination comprising:

an output terminal;

first and second power terminals for the application therebetween of an operating potential;

means for connecting a load between said first power terminal and said output terminal;

an output transistor having a base, an emitter, and a collector;

means connecting the collector of said output transistor to said output terminal;

means for connecting the emitter of said output transistor to said second power terminal;

means for applying an input signal to the base of said output transistor for normally producing at said output terminal signals varying between the potentials at said first and second power terminals;

all potentials between the voltages applied to said first and second power terminals defining voltages of first polarity;

a parasitic transistor formed within said IC having an emitter region common to the collector of said output transistor, a base region common to the emitter of said output transistor and having a collector region common to other regions of said IC, said parasitic transistor being turned-on when a reverse potential is applied at said output terminal of a polarity to forward bias said emitter of said parasitic transistor relative to its base, and have a magnitude to exceed the base to emitter voltage of said parasitic transistor;

a control transistor having a base, an emitter and a collector;

means for connecting said collector of said control transistor to an operating potential of same polarity as that applied to said first point of operating potential;

means for connecting said emitter of said control transistor to said output terminal; and means for applying a bias voltage to the base of said control transistor having a value to prevent current conduction in said control transistor when the potential at said output terminal is of said first polarity and having a value to turn-on said control transistor and maintain said parasitic transistor turned-off in response to the presence of said reverse potential at said output terminal.

4. In an integrated circuit (IC) in which the collector of an output transistor is connected to an output terminal and its emitter and the substrate of the IC are returned to a first operating potential and its base is coupled to receive an input signal and in which the collector of said output transistor can function as the emitter of a parasitic transistor whose base is common to said substrate and whose collector is common to other regions in said IC and wherein a load connected to said output terminal can develop a reverse potential at said output terminal which, when it exceeds a given value, tends to cause a current to flow between the base and emitter of said parasitic transistor in a direction to cause said parasitic transistor to conduct, means for controlling the conductivity of the parasitic transistor comprising:

a control transistor having a base, an emitter and a collector;

means connecting the emitter of said control transistor to said output terminal;

means for coupling the collector of said control transistor to a point of operating potential; and means for applying a bias voltage to the base of said control transistor for turning-on said control transistor only when the voltage at said output terminal is of the same polarity as said reverse potential and is at a first value which is less than said given value and for then maintaining the potential at said output terminal at a value which is less than said given value thereby preventing base-to-emitter current flow in said parasitic transistor.

5. In an integrated circuit (IC) in which an output transistor has its conduction path connected between an output terminal and a first node of operating potential and its control electrode coupled to receive an input signal, and in which the output transistor normally conducts current in one direction between said output terminal and said first node and wherein a reverse potential may be developed at said output terminal which, when it exceeds a given value, tends to cause a reverse current to flow between said first point and said output terminal in a direction opposite to said one direction, means for counteracting the tendency of said reverse current to flow comprising:
- a control transistor having a base, an emitter, and a collector;
- a reference voltage node for the application thereto of a reference voltage;
- a second node for the application thereto of an operating potential;
- means connecting the collector of said control transistor to said second node;
- means, including a diode, connecting the base of said control transistor to said reference voltage node, said diode being poled to conduct in the same direction as the base-to-emitter junction of said control transistor;
- means, connecting the emitter of said control transistor to said output terminal; and
- wherein said reference voltage has a value to cause said control transistor to turn-on before the reverse potential at said output terminal exceeds said given value, said control transistor, when turned on, causing a flow of current between said second node and said output terminal of a magnitude sufficient to prevent the voltage at said output terminal from exceeding said given value.

6. In an integrated circuit (IC) in which an output bipolar transistor has its collector connected to an output terminal, its emitter connected to a first node of operating potential, and its base connected to a signal point, and in which the collector of said output transistor can function as the emitter of a parasitic transistor whose base is common to the substrate on which the IC is formed and whose collector is common to other circuits formed on said IC, and in which the output transistor normally conducts current in one direction between said output terminal and said first node and wherein a reverse potential may be developed at said output terminal which, when it exceeds a given value, tends to turn-on said parasitic transistor and cause a reverse current to flow between said first point and said output terminal via the conduction path of said parasitic transistor in a direction opposite to said one direction, means for counteracting the tendency of said reverse current to flow comprising:
- a normally non-conducting means connected between a voltage source and said output terminal responsive to said reverse potential when it attempts to exceed said given value for turning-on said non-conducting means for causing a flow of current through said means between said voltage source and said output terminal of a magnitude sufficient to prevent the voltage at said output terminal from exceeding said given value and the turn-on of said parasitic transistor.

* * * * *